United States Patent [19]

Lester

[11] Patent Number: 5,043,796
[45] Date of Patent: Aug. 27, 1991

[54] ISOLATING MULTIPLE DEVICE MOUNT WITH STRESS RELIEF

[75] Inventor: Theodore V. Lester, Schiller Park, Ill.

[73] Assignee: Motorola, Inc., Schaumburg, Ill.

[21] Appl. No.: 475,550

[22] Filed: Feb. 6, 1990

[51] Int. Cl.⁵ .............................................. H01L 23/48
[52] U.S. Cl. ........................................ 357/81; 357/71; 357/75; 357/58
[58] Field of Search ............................... 357/81, 75, 55

[56] References Cited

U.S. PATENT DOCUMENTS 3,829,598  8/1974  Darnell ................................. 357/81
4,236,296 12/1980  Woolhouse ........................... 357/55

OTHER PUBLICATIONS

Ng et al., Packaging Micro Miniature Devices, 2/3/87 (U.S. Statutory Invention Registration).

*Primary Examiner*—Eugene R. Laroche
*Assistant Examiner*—R. Ratliff
*Attorney, Agent, or Firm*—Phillip H. Melamed

[57] ABSTRACT

A substrate of copper clad alumina lamina bearing a number of semiconductor dies is adapted to be soldered to a heatsink to provide electrically isolated thermal relief for the dies. Channels of reduced lamina depth are provided between the dies in regions of no cladding to provide a stress relief fracture path. Stresses caused by the mismatch between the thermal coefficient of expansion of the lamina and is heatsink as the substrate is temperature cycled are fracture relieved without risk of die damage or die or substrate detachment.

12 Claims, 1 Drawing Sheet

ISOLATING MULTIPLE DEVICE MOUNT WITH STRESS RELIEF

TECHNICAL FIELD

This invention relates to substrates as may be used in power handling applications, that is, as mounts for energy dissipating devices such as for example power semiconductor dies, power resistors, or any power dissipating device that might be mounted on a ceramic or similar substrate.

Ceramic substrates are used instead of conventional printed circuit boards when superior tolerance to mechanical shock or temperature is desired. The ceramic material most commonly used for such a substrate is alumina, but other materials with similar properties are available. A typical application is the mounting of a power dissipating semiconductor die to be thermally coupled to a metal heatsink and electrically isolated therefrom.

BACKGROUND OF THE INVENTION

Where electrical isolation for dies constituting power devices is required, a layer of dielectric material, such as alumina, may be disposed between the semiconductor die material constituting the device and its associated heatsink. After being formed by rolling from its liquid or green state, and fired the alumina may be clad with copper by a eutectic bonding process and the die soldered to the clad alumina as a substrate. The opposite surface of the alumina may then be soldered in turn to a metal heatsink. Alternatively, the soldered attachments may be achieved by other methods of forming a solderable surface on alumina.

Unfortunately, mismatch between the thermal coefficients of expansion of alumina (6.4 parts per million per degrees C) and the metal of the heatsink such as for example copper (17 parts per million per degree C), limits the size of clad alumina substrate which can be soldered to a heatsink without unacceptable risk of stress damage during thermal cycling. A further problem with large substrates is the difficulty of obtaining a void-free attachment of the soldered surfaces.

The drawbacks of large substrates results in a practical limit of about 1 in. by 1 in. being placed on the substrate. In large circuits, therefore, multiple substrates for example individually attached to a common heatsink are used resulting in more expensive assembly and potentially unreliable interconnections, particularly since, even with mechanized assembly techniques, good registration in the placement of multiple substrates is difficult.

Where such multiple substrates are employed, they may be formed from a common piece of substrate material having grooves scored therein to give fault lines of preferred fracture when subjected to bending. Such material is sometimes referred to in the art as 'snap-strate' since in use dies are first soldered to the substrate as a single piece which is then snapped along its grooves to form a plurality of acceptably small substrates for attachment to the heatsink. Any interconnections required between dies are then made, for example by wire bonding.

SUMMARY OF THE INVENTION

According to the present invention, a substrate having sites for mounting a plurality of energy dissipating devices includes a lamina of dielectric material possessing a first thermal coefficient of expansion,
said substrate being adapted for attachment to a heatsink possessing a second thermal coefficient of expansion,
said substrate having, between sites a region of reduced lamina thickness,
said region being adapted to constitute a zone of preferential fracture propagation in the event of a thermally induced fracturing strees being applied to said substrate.

Preferably, the region is continuous from one lamina edge to another and profiled as a groove. Advantageously, grooves on each side of the lamina may be aligned. Alternatively, a plurality of directionally co-operating elongate regions may provide an extended line of preferential fracture. Advantageously, such elongate regions have aligned corners, preferably being diamond shaped and aligned apex-wise. To further advantage, the regions may be constituted by perforations.

In one form of the present invention, the substrate may have a conductive cladding, which may span the line of preferential fracture propagation. Where a plurality of co-operating regions are present, the cladding may span the extended line of preferential fracture. Such cladding span remains intact should fracture occur to provide an electrical connection.

BRIEF DESCRIPTION OF THE DRAWINGS

In order that features and advantages of the present invention may be more fully appreciated, an embodiment will now be described with reference to the accompaying diagrammatic drawings, of which.

BEST MODE FOR CARRYING OUT THE INVENTION

Figure 1:
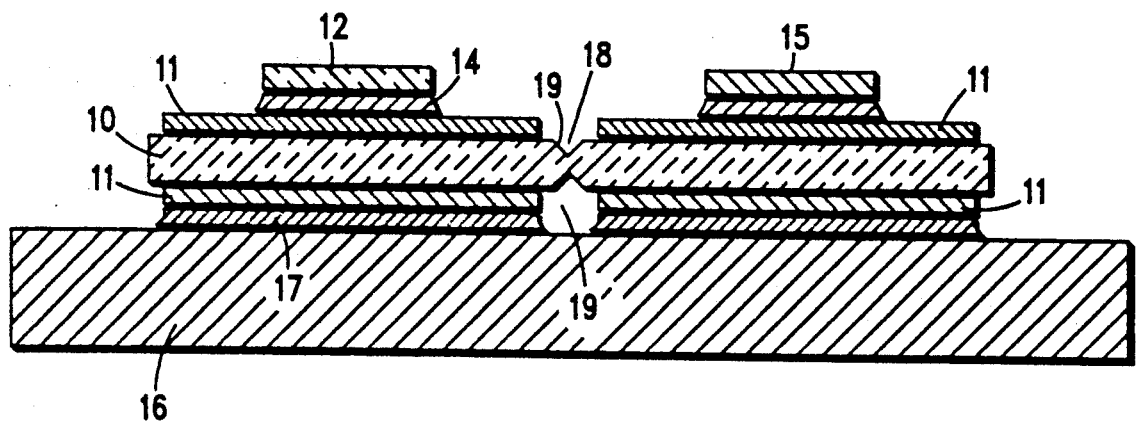
FIG. 1 represents a heatsink mounted die bearing substrate in accordance with the present invention.

A substrate 10 (FIG. 1) of alumina has a covering 11 of copper deposited upon its upper and lower surfaces. The substrate provides a plurality of sites for semiconductor dies, such as die 12, which is attached to the copper covering 11 of the substrate 10 by means of a soldering 14. A further die 15 is similarly joined to the substrate 10 at a second site. Dies 12 and 15 may, for example, be power field effect transistors capable of considerable heat dissipation. When the mounted dies are to be used in a circuit therefore the substrate/die assembly is joined to a metal heatsink 16 by a further soldering 17.

It will be appreciated that as may be desirable in for example high voltage applications, the substrate provides isolation of the dies from their temperature relieving heatsink. An operational circuit may be formed by connections (not shown) made by wire bonding to or between the dies, or via the copper covering or some combination thereof. In an uncovered portion 18 of the substrate between die sites a region of reduced depth, formed by cooperating upper and lower grooves 19 and 19' respectively, provides a zone of preferred fracture propagation.

It will be appreciated that in the event of stress being applied to the substrate, any fracture which occurs as a result of such stress will occur in the region of reduced depth. Hence, stress relief is provided by such a fracture without risk of functional damage to the substrate or the device. It will further be appreciated that since the substrate constitutes a single component during manufacture, its carried dies will be in register for assembly or connection making by correct placement of a single substrate, unlike prior art arrangements, wherein a plurality of individually substrate mounted dies would be needed.

Figure 2:
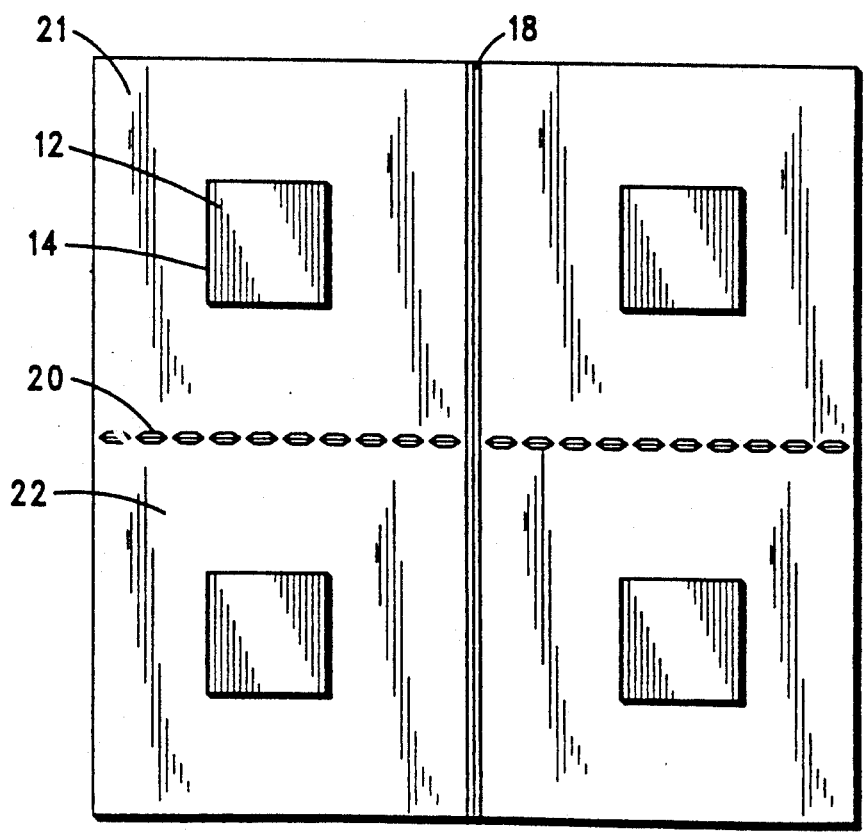
FIG. 2 represents a plan view of an exemplary substrate.

In the present embodiment, the substrate 10 provides four die sites, stress relief being provided by a continuous region of reduced depth 18 running from edge to edge along a site boundary, as may be more clearly seen in FIG. 2. Further stress relief is provided by a plurality of cooperating regions, such as region 20, also aligned edgewise. Each such region is a diamond shaped region with surface apexes running in the direction of alignment. This latter arrangement may be used to provide electrical continuity between, for example, sites 21 and 22 even after stress relieving fracture has occurred, since the copper remaining between sites will continue to span the fracture, the substrate movement at fracture being slight.

The manufacture of a circuit assembly with a multi-die substrate in accordance with the present invention will now be considered.

Firstly, die are placed at their required location in relation to the substrate. Soldering may be achieved by a reflow process, that is the dies are initially attached with an adhesive solder paste, which melts to give a full soldered joint when taken to an elevated temperature by a reflow oven. The soldering provides electrical connection to the copper covering of the substrate of any die pads arranged on the making surface. Other interconnections by wire bonds could be made now or later when the substrate is heatsink mounted and external connections may be made. It will be appreciated that many dies may be soldered in a single reflow pass.

The die/substrate assembly may then be soldered to the heatsink. Again, a reflow technique may be used, advantageously with a lower temperature paste so that die solder will not be disturbed. Solder will not adhere in the regions of reduced substrate depth, since there is no copper covering. It will be appreciated that all the dies carried by the substrate will have been provided with a heatsinking path and be correctly positioned in this single operation. Correct registration is important if automatic equipment, for example, wire bonding equipment, is to be used to provide connections to external terminals. The present invention avoids the placement of a plurality of small substrates associated with multiple die circuits in the prior art. Further the problem of providing a void-free soldered joint between the substrate and the heatsink is eased since the channels formed by the regions of reduced depth act as an escape path for the flux gasses evolved during soldering.

The assembly may now be finished by encasing the substrate structure within a plastic cover (not shown) attached to the heatsink, the latter carrying bolt holes for mounting the finished package. The space around the die substrate structure may be filled with a silicon based gel which acts to prevent electrical creepage, and consequent compromise of isolation, around substrate edges, including any edges formed as a result of stress relief fracture.

It is unlikely that fracture will occur during the thermal cycling of the lamina when the substrate is soldered to its heatsink. Fracture is more likely as time goes on and the substrate is repeatedly cycled by its own thermal dissipation, particularly as the soldered joints become work-hardened. However, the grooves in the substrate, which may be arranged with a sharp bottom edge, provide a fault which allows a stress relieving fracture to occur without damage to circuit integrity.

When a fault is formed by a plurality of aligned regions, the interregion covering will remain soldered to the heatsink, even though the proximate alumina fractures. Hence, any electrical paths so formed will be preserved. Equally unsoldered interregion copper will be intact after stress relief.

Channels may be formed in the substrate by grinding or by etching in uncovered regions, the covering being selectively deployed accordingly. Alternatively, channels may be formed in the lamina before covering as part of the alumina green rolling process. It will be appreciated that a use of castellated wheel during rolling will provide a plurality of aligned regions. A complementary application of copper covering completes the substrate.

The invention provides an improvement in the size of substrate that may be succesfully employed of at least a ratio of 4:1 over the prior art. This improvement, however does not represent the limit of what may be achieved by application of the present invention.

It will further be appreciated that the invention is a considerable departure from the prior art 'snap-strate' technique since a substrate bearing a plurality of dies is affixed to its heatsink in one piece. In the prior art portions of substrate which was adapted to split by mechanical stress were separated to be individually heatsink mounted.

What is claimed is:

1. An assembly for a substrate and heatsink, comprising:
   a substrate having sites for mounting a plurality of energy dissipating devices including a lamina of dielectric material possessing a first thermal coefficient of expansion,
   a heatsink possessing a second thermal coefficient of expansion substantially different from said first thermal coefficient of expansion, said substrate being attached to said heatsink;
   said substrate having, between said sites, a region of reduced lamina thickness,
   said region being adapted to constitute a zone of preferential fracture propagation in the event of a thermally induced fracturing stress being applied to said substrate by said heatsink.

2. An assembly as claimed in claim 1 and wherein said region is continuous from one lamina edge to another.

3. An assembly as claimed in claim 1 and wherein the region is profiled as a groove.

4. An assembly as claimed in claim 3 with said substrate having aligned grooves on each side of the lamina.

5. An assembly as claimed in claim 1 and wherein a plurality of directionally co-operating elongate regions of said substrate provide an extended line of preferential fracture.

6. An assembly as claimed in claim 5 and wherein said elongate regions have aligned corners.

7. An assembly as claimed in claim 5 and wherein said elongate regions are constituted by perforation of the lamina.

8. An assembly as claimed in claim 1 with said substrate having a conductive cladding and including semiconductor devices mounted at said sites on portions of said cladding.

9. An assembly as claimed in claimed in claim 8 and wherein said cladding spans said zone of preferential fracture propagation.

10. An assembly as claimed in claim 5 wherein said substrate has a conductive cladding and wherein said cladding spans said extended line of preferential fracture.

11. An assembly as claimed in claim 1 wherein said substrate comprises a ceramic substrate and wherein said heat sink comprises a metal heat sink on which said ceramic substrate is mounted.

12. An assembly as claimed in claim 8 wherein said energy dissipating devices comprise said semiconductor devices which comprise semiconductor die which are mounted on portions of said cladding.

* * * * *